(12) United States Patent
Kokusenya

(10) Patent No.: US 7,847,361 B2
(45) Date of Patent: Dec. 7, 2010

(54) SOLID STATE IMAGING DEVICE IN WHICH A PLURALITY OF IMAGING PIXELS ARE ARRANGED TWO-DIMENSIONALLY, AND A MANUFACTURING METHOD FOR THE SOLID STATE IMAGING DEVICE

(75) Inventor: Noboru Kokusenya, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/167,618

(22) Filed: Jul. 3, 2008

(65) Prior Publication Data

US 2009/0014823 A1 Jan. 15, 2009

(30) Foreign Application Priority Data

Jul. 12, 2007 (JP) .............................. 2007-183165

(51) Int. Cl.
*H01L 31/0232* (2006.01)
(52) U.S. Cl. ........................ 257/435; 257/433; 257/436; 257/446; 257/432; 257/E31.127
(58) Field of Classification Search .................. 257/432, 257/435, 433, 436, 446, E31.127
See application file for complete search history.

(56) References Cited

U.S. PATENT DOCUMENTS 7,023,034 B2 * 4/2006 Kuriyama .................... 257/291

2001/0024184 A1 * 9/2001 Maeda ........................ 345/87
2006/0169878 A1 8/2006 Kasano et al.
2006/0186547 A1 * 8/2006 Wang et al. .................. 257/758

FOREIGN PATENT DOCUMENTS

JP 2001-077339 3/2001

* cited by examiner

*Primary Examiner*—Ngan Ngo
*Assistant Examiner*—Benjamin Tzu-Hung Liu
(74) *Attorney, Agent, or Firm*—McDermott Will & Emery LLP

(57) ABSTRACT

A solid state imaging device includes a plurality of imaging pixels that are arranged two-dimensionally along a main face of a semiconductor substrate. Each imaging pixel in the solid state imaging device includes a photodiode that performs photoelectric conversion and a color filter that is disposed higher in the Z axis direction than the photodiode. Also, light blocking portions have been formed between pairs of adjacent imaging pixels, on the main face of the semiconductor substrate to a height in a thickness direction (Z axis direction) of the semiconductor substrate that is substantially equal to or higher than top edges of the optical filters. Each light blocking portion is constituted from a combination of a light blocking film and a light blocking wall.

11 Claims, 16 Drawing Sheets

FIG.11A
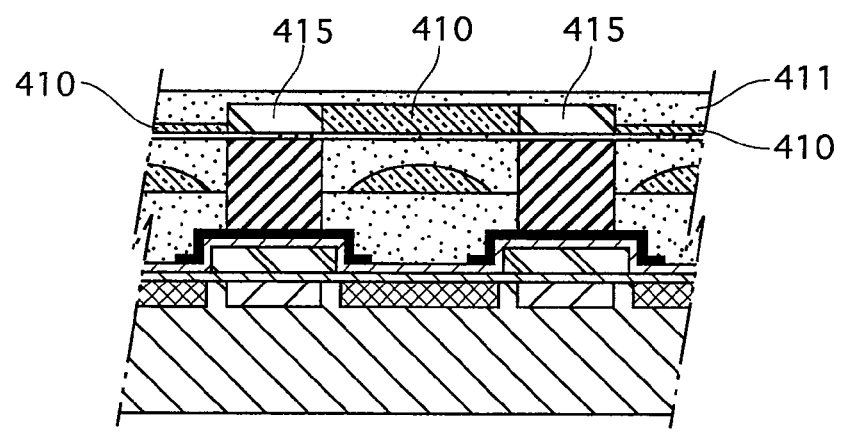
FIG.11B
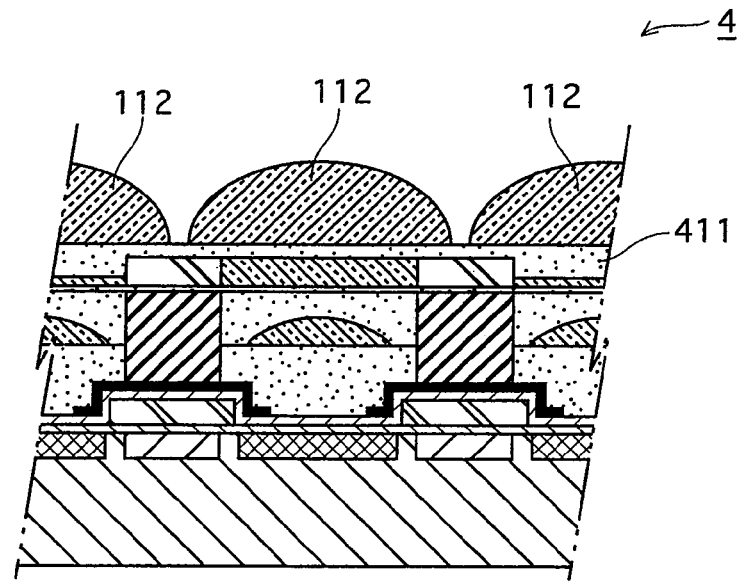
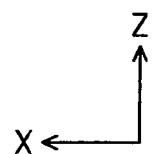

ABSTRACT TEXT NOT FULLY SHOWN

SOLID STATE IMAGING DEVICE IN WHICH A PLURALITY OF IMAGING PIXELS ARE ARRANGED TWO-DIMENSIONALLY, AND A MANUFACTURING METHOD FOR THE SOLID STATE IMAGING DEVICE

BACKGROUND OF THE INVENTION

1. Field of the Invention

The present invention relates to a solid state imaging device and a manufacturing method for the same, and in particular to technology for blocking light between adjacent imaging pixels.

2. Description of the Related Art

In recent years, solid state imaging devices have been used in a wide range of devices including digital video cameras, digital still cameras, and mobile phones. One structure of a solid state imaging device is described below with reference to FIG. 1. The solid state imaging device shown in FIG. 1 is proposed in Japanese Patent Application Publication No. 2001-77339, and aims to suppress color mixing etc.

As shown in FIG. 1, the solid state imaging device includes a semiconductor substrate 900 and a gate insulation film 903 that has been formed on a main face thereof (in FIG. 3, the upper face in the Z axis direction). Photodiodes 901 having gaps therebetween have been formed at a boundary between the semiconductor substrate 900 and the gate insulation film 903. The photodiodes 901 are two-dimensionally arranged along the main face of the semiconductor substrate 900. Transfer channels 902 have been formed between pairs of adjacent photodiodes 901.

Polysilicon gates (hereinafter, called "PS gates") 904 have been formed on the gate insulation film 903 in correspondence with the transfer channels 902, and an interlayer insulation film 905 and a light blocking film 906 have been formed so as to cover the PS gates 904. Note that apertures have been formed in the light blocking film 906 in correspondence with the photodiodes 901.

Light blocking walls 913 have been provided upright on the light blocking film 906. Insulation films 907 and planarizing films 909 have been formed in the spaces between the light blocking walls 913. Intra-layer lenses 908 have been formed at a boundary between the insulation films 907 and the planarizing films 909 in correspondence with the photodiodes 901. A protection film 914, a color filter 910, a planarizing film 911, and top lenses 912 have been formed in the stated order on the planarizing films 909 and the light blocking walls 913.

Japanese Patent Application Publication No. 2001-77339 discloses that stray light is prevented from entering adjacent imaging pixels by providing a light blocking wall 913 between the light blocking film 906 and the protection film 914 in each imaging pixel, thereby suppressing color mixing.

However, reliably preventing stray light from entering adjacent imaging pixels is difficult, even when the structure proposed in Japanese Patent Application Publication No. 2001-77339 is used. As shown in FIG. 1, in the solid state imaging device proposed by Japanese Patent Application Publication No. 2001-77339, the top edges of the light block walls 909 are located below the protection film 914, and there are cases in which light passing through the color filter 910 leaks into adjacent imaging pixels. A portion of the light that has leaked into an adjacent imaging pixel is reflected by a light blocking wall 913 and reaches the photodiode 901 of an imaging pixel into which the light was not intended to enter.

Such color mixing is particularly problematic in view of progress in reducing the size of imaging pixels while increasing the number of pixels. This problem arises from the fact that it is much more difficult to achieve a reduction in size in the thickness direction of the semiconductor substrate 900 than in a direction along the arrangement of the photodiodes 901.

SUMMARY OF THE INVENTION

The present invention has been achieved in view of the above problem, and an aim thereof is to provide a solid state imaging device that effectively suppresses occurrences of color mixing regardless of imaging pixel size, and a manufacturing method for the solid state imaging device.

In order to achieve the above, the present invention has the following structure.

One aspect of the present invention is a solid state imaging device in which a plurality of imaging pixels are arranged two-dimensionally along a main face of a semiconductor substrate with gaps between adjacent imaging pixels, the solid state imaging device including: a plurality of light receiving portions that are operable to perform photoelectric conversion and have been formed in one-to-one correspondence with the plurality of imaging pixels; a plurality of optical filters that have been formed in one-to-one correspondence with the plurality of imaging pixels and are disposed above the plurality of light receiving portions; and a plurality of light blocking portions that are operable to block light, each being provided between a different pair of adjacent imaging pixels and having been formed on the main face of the semiconductor substrate to a height in a thickness direction of the semiconductor substrate that is greater than or substantially equal to top edges of the plurality of optical filters.

Another aspect of the present invention is a manufacturing method for a solid state imaging device in which a plurality of imaging pixels are arranged two-dimensionally along a main face of a semiconductor substrate with gaps between adjacent imaging pixels, including the steps of: forming a plurality of light receiving portions in one-to-one correspondence with the plurality of imaging pixels, each light receiving portion being operable to perform photoelectric conversion; forming a plurality of optical filters above the plurality of light receiving portions and in one-to-one correspondence with the plurality of imaging pixels; and forming a plurality of light blocking portions that are operable to block light, each being formed between a different pair of adjacent imaging pixels, on the main face of the semiconductor substrate to a height in a thickness direction of the semiconductor substrate that is greater than or substantially equal to top edges of the plurality of optical filters.

According to the above structure, the solid state imaging device of the present invention includes light blocking portions that have been formed between pairs of adjacent imaging pixels, on the main face of the semiconductor substrate to a height in a thickness direction of the semiconductor substrate that is substantially equal to or higher than top edges of the optical filters. In other words, the light blocking portions in the solid state imaging device of the present invention have been formed to a height that is substantially equal to at least the top edges of the optical filters.

In the solid state imaging device of the present invention, light is blocked by the light blocking portions even when passing through the optical filters, thereby eliminating the leakage of light into adjacent imaging pixels. This superior effect is achieved regardless of the size of the imaging pixel.

Accordingly, the solid state imaging device of the present invention effectively suppresses color mixing regardless of the size of imaging pixels.

Note that in the solid state imaging device of the present invention, a gate insulation film has been formed on the surface of the semiconductor substrate. Since the film thickness of the gate insulation film is smaller than the visible bandwidth region of light, the gate insulation film also has light blocking properties.

Variations such as the following are also applicable to the solid state imaging device of the present invention.

The solid state imaging device of the present invention may further include a plurality of transfer channels, each having been formed between a different pair of adjacent light receiving portions on the main face of the semiconductor substrate and in close proximity to one of the adjacent light receiving portions and a plurality of transfer electrodes that have been formed on the main face of the semiconductor substrate in one-to-one correspondence with the plurality of transfer channels. That is to say, the present invention is also applicable to a CCD type solid state imaging device. In this case, a light blocking film may have been formed above the main face of the semiconductor substrate so as to cover upper faces and lateral faces of the plurality of transfer electrodes; and a plurality of light blocking walls may have been provided on or above the light blocking film and standing upright in the thickness direction of the semiconductor substrate, wherein each light blocking portion includes the light blocking film and a different one of the light blocking walls.

Also, in the solid state imaging device of the present invention, the plurality of light blocking walls may be composed of an inorganic material.

Also, in the solid state imaging device of the present invention, the plurality of light blocking walls may be composed of one or more materials selected from the group consisting of W, TiN, Ti, and Al.

Also, in the solid state imaging device of the present invention, the plurality of light blocking walls may be composed of an inorganic material and an organic material.

Also, in the solid state imaging device of the present invention, the plurality of light blocking walls may be composed of a resin material and one or more materials selected from the group consisting of W, TiN, Ti, and Al.

Also, in the solid state imaging device of the present invention, the light blocking film may be electrically insulated from the plurality of light blocking walls.

Also, the solid state imaging device of the present invention may further include a plurality of intra-layer lenses, each having been formed between the light receiving portion and the optical filter of a different one of the imaging pixels.

Also, in the solid state imaging device of the present invention, each of the intra-layer lenses may be convex in an upward direction or a downward direction with respect to the thickness direction of the semiconductor substrate, or convex in both the upward direction and the downward direction.

Also, the solid state imaging device of the present invention may further include a plurality of top lenses, each having been formed above a different one of the optical filters in the plurality of imaging pixels.

Also, in the solid state imaging device of the present invention, top edges of the light blocking portions may be positioned at or in a proximity of bottom edges of the plurality of top lenses.

Also, in the solid state imaging device of the present invention, each of the light blocking portions may include a part whose cross-sectional area gradually decreases in an upward direction with respect to the thickness direction of the semiconductor substrate. Also, the solid state imaging device of the present invention may further include a planarizing film that has been formed between (i) a first area of each light blocking portion that is substantially equal in height to an area in which the plurality of color filters have been formed and (ii) a second area of each light blocking portion that is below the first area, wherein a thickness of the planarizing film may be smaller than a visible wavelength band of light.

The manufacturing method for the solid state imaging device of the present invention enables easily manufacturing the solid state imaging device of the present invention.

BRIEF DESCRIPTION OF THE DRAWINGS

These and other objects, advantages, and features of the invention will become apparent from the following description thereof taken in conjunction with the accompanying drawings, which illustrate specific embodiments of the present invention.

In the drawings:

FIGS. 11A and 11B show steps in the manufacturing processing for the imaging pixel, in the manufacturing process for the solid state imaging device 4;

DESCRIPTION OF THE PREFERRED EMBODIMENTS

Embodiments of the present invention are described below with reference to the drawings.

The embodiments described below are merely examples used to clearly describe the structure, operations, and effects of the present invention. Therefore, the present invention should not be limited to these embodiments other than with respect to the gist of the embodiments.

Embodiment 1

1. Overall Structure

Figure 2:
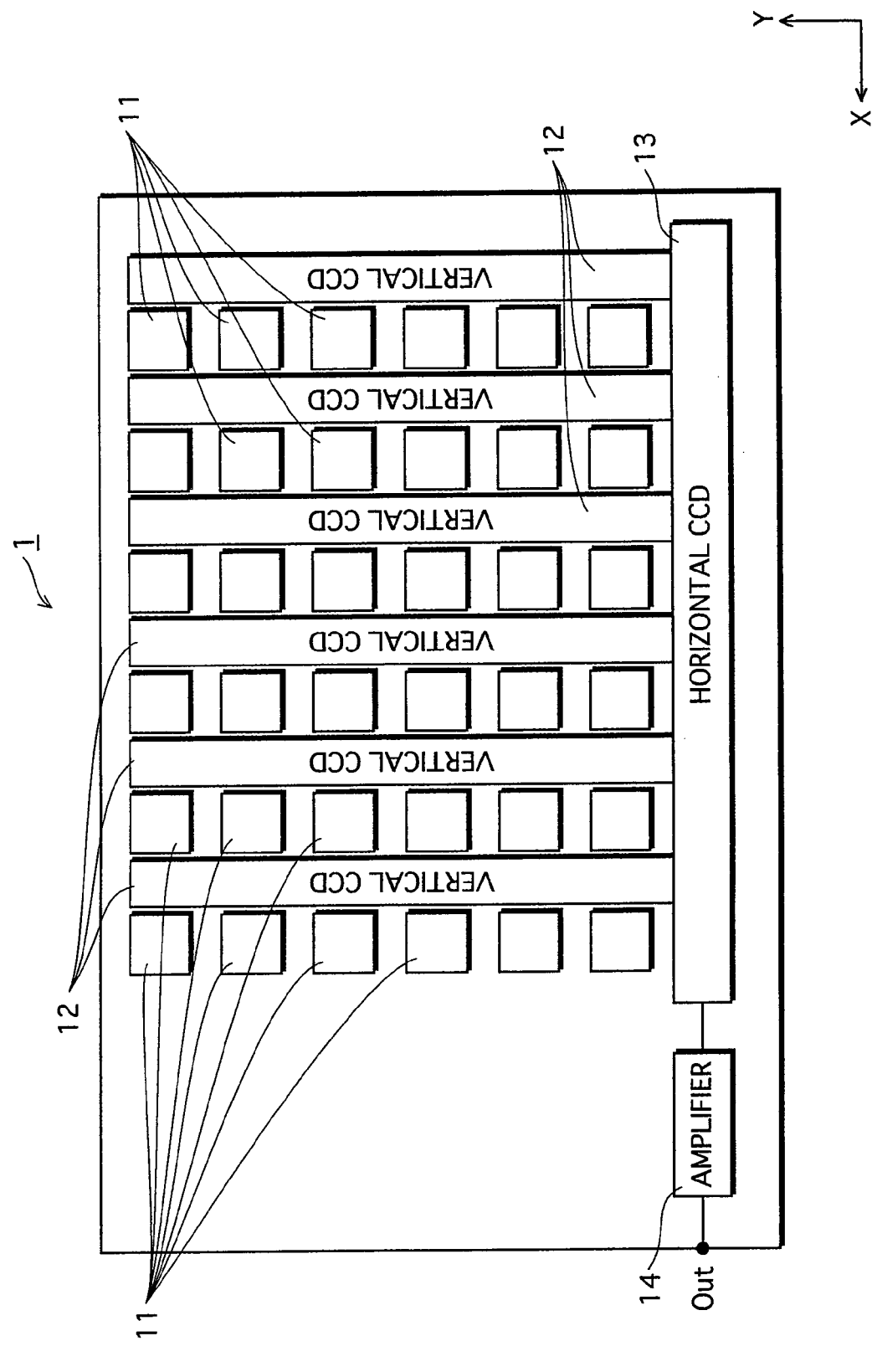
FIG. 2 is a block diagram showing an overall structure of a solid state imaging device 1 pertaining to embodiment 1.

The following describes the overall structure of a solid state imaging device 1 of the present embodiment with reference to FIG. 2.

As shown in FIG. 2, the solid state imaging device 1 is made up of a plurality of imaging pixels 11 arranged in a matrix and circuitry. The circuitry includes vertical CCDs 12 that are arranged extending in the Y axis direction between adjacent columns of imaging pixels 11, a horizontal CCD 13 arranged extending in the X axis direction, and an amplifier 14 connected to the horizontal CCD 13. Although the structure of an interline (IT) CCD type of solid state imaging device is described in the present embodiment, this is merely one example.

The vertical CCDs 12 receive signal charges generated by photoelectric converters on which light has incidented, and transfer the signal charges downward in the Y axis direction. The signal charges in the vertical CCDs 12 are transferred to the horizontal CCD 13 sequentially and in parallel, and thereafter are output via the amplifier 14.

2. Structure of Imaging Pixels 11 and Vertical CCDs 12

Figure 3:
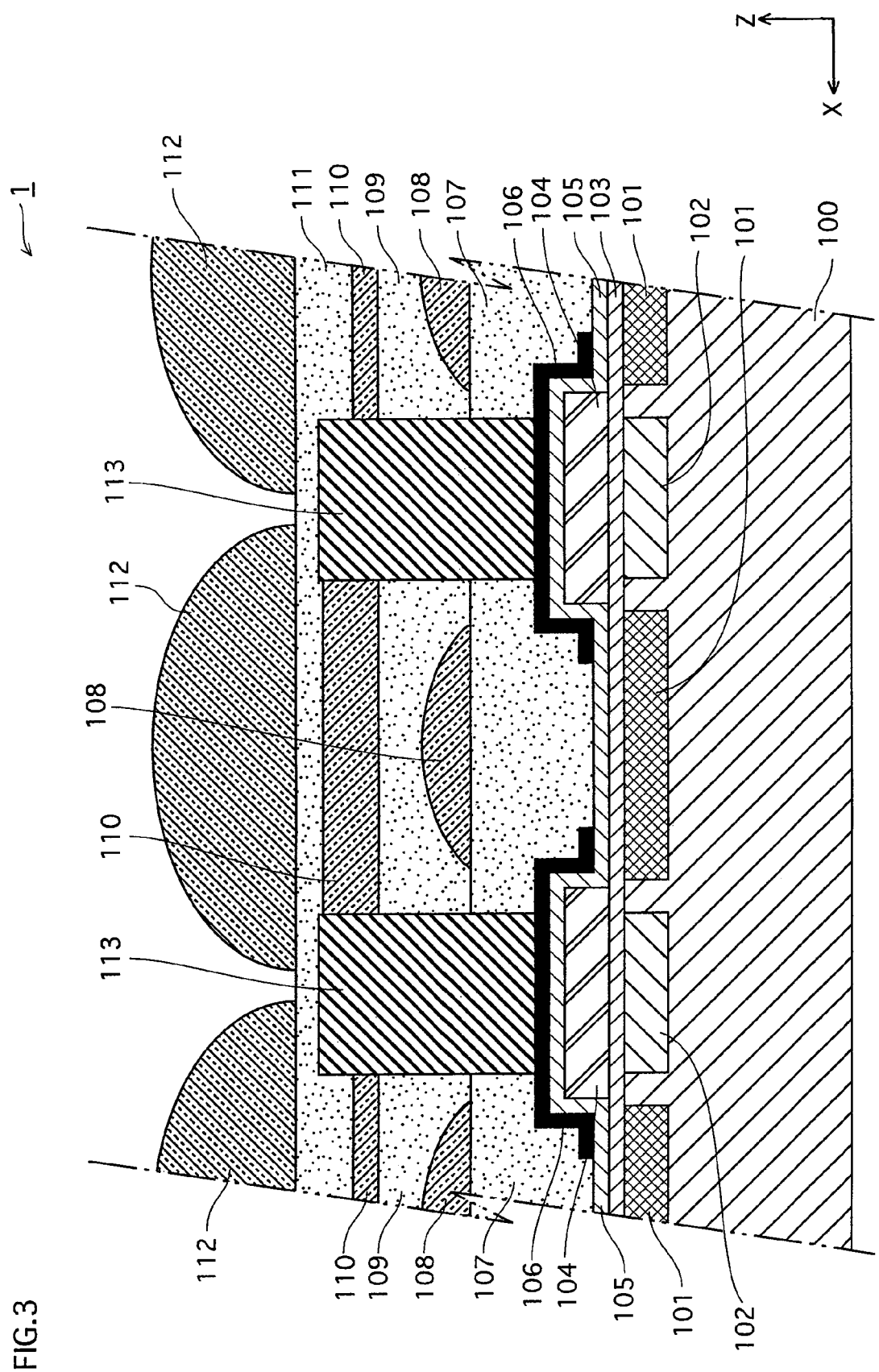
FIG. 3 is a cross-sectional view diagrammatically showing a structure of an imaging pixel 11 in the solid state imaging device 1.

The following describes the structures of the imaging pixels 11 and the vertical CCDs 12 constituting the solid state imaging device 1 with reference to FIG. 3.

As shown in FIG. 3, in the imaging pixels 11 and vertical CCDs 12 of the solid state imaging device 1, a gate insulation film 103 has been formed on a surface of a semiconductor substrate 100 (in FIG. 3, the upper face). In a vicinity of a lower interface of the gate insulation film 103, a plurality of photodiodes 101 have been formed along a direction of the lower interface and with gaps therebetween. Also, transfer channels 102 have been formed between adjacent rows of photodiodes 101.

In each imaging pixel 11, a transfer gate (not depicted) has been provided between the photodiode 101 and transfer channel 102. Also, channel stop areas (not depicted) for separating charge transfer areas have been provided between the transfer channels 102 and photodiodes 101 of adjacent imaging pixels 11.

In the solid state imaging device 1, the gate insulation film 103 has been formed so as to cover the photodiodes 101, transfer channels 102, etc. Polysilicon gates (hereinafter, called "PS gates") 104 have been formed on the gate insulation film 103 in positions above the transfer channels 102. The PS gates 104 are covered by an interlayer insulation film 105, and a light blocking film 106 has been formed on the interlayer insulation film 105 so as to cover the PS gates 104 and peripheries thereof. Apertures have been formed in the light blocking film 106 in positions above the photodiodes 101.

Each vertical CCD 12 in the solid state imaging device 1 is constituted from one of the transfer channels 102, one of the PS gates 104, and the gate insulation film 103 therebetween.

Light blocking walls 113 have been provided upright in the Z axis direction on the light blocking film 106. The light blocking walls 113 are composed of inorganic materials such as tungsten (W), titanium nitride (TiN), titanium (Ti), and aluminum (Al). Insulation films 107, planarizing films 109, and color filters 110 have been formed in the stated order on the interlayer insulation film 105 and light blocking film 106 in the areas between adjacent light blocking walls 113. In each imaging pixel 11, an intra-layer lens 108 that is convex in the Z axis direction has been formed at a boundary between the insulation film 107 and planarizing film 109.

Note that the thickness and structure of each color filter 110 is set in accordance with the wavelength band of light that is to be transmitted to the corresponding imaging pixel 11.

A planarizing film 111 has been formed on the light blocking walls 113 and color filters 110, and a top lens 112 has been formed on the planarizing film 111 in each imaging pixel 11. Note that in the solid state imaging device 1 of the present embodiment, the top edges of the light blocking walls 113 are higher in the Z axis direction than the upper faces of the color filters 110 in all of the imaging pixels 11.

3. Superiority

Figure 1:
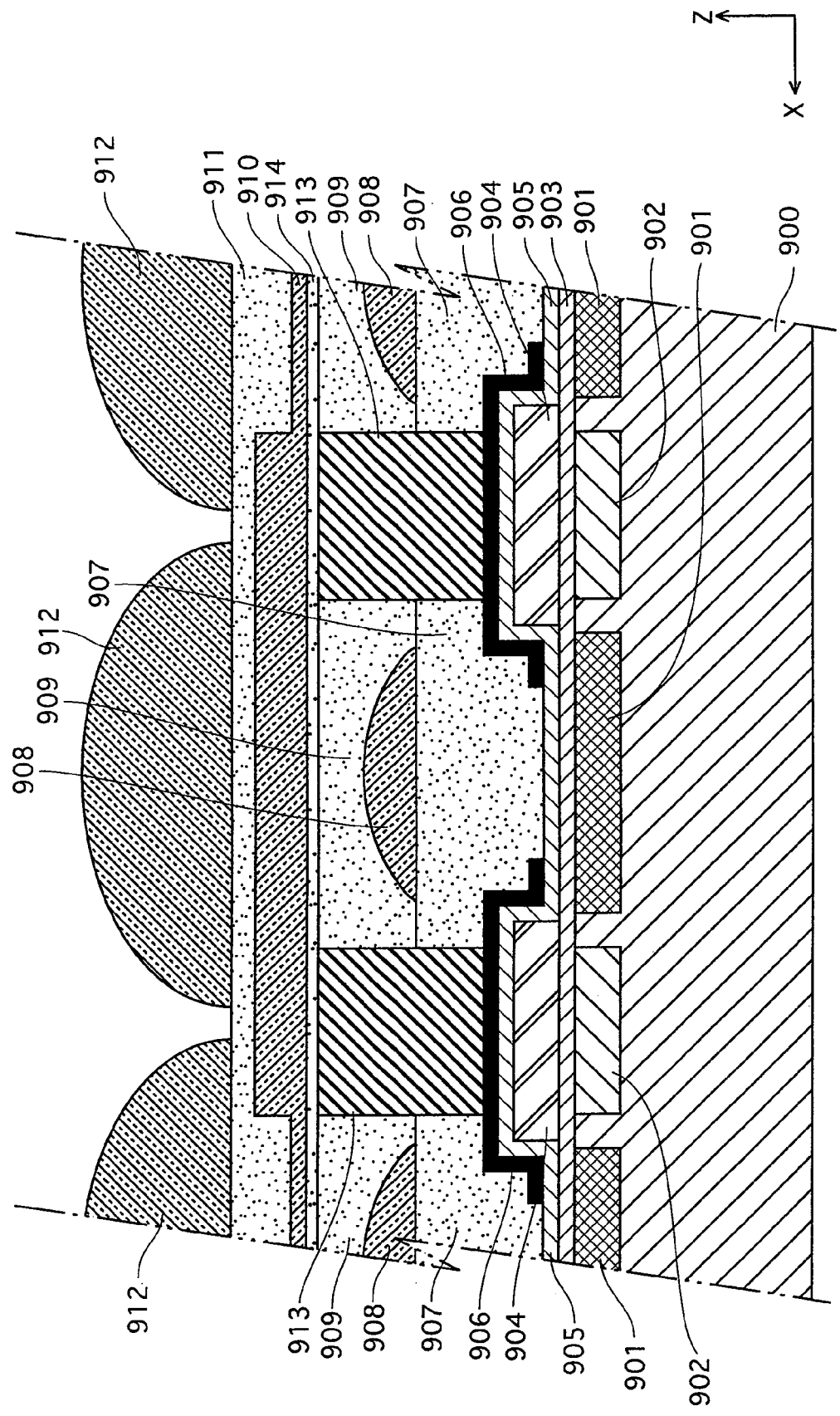
FIG. 1 is a cross-sectional view showing a structure of an imaging pixel in a solid state imaging device pertaining to the prior art.

A comparison of the solid state imaging device 1 of the present embodiment and the solid state imaging device of the prior art shown in FIG. 1 reveals a difference in the position of the top edges of the light blocking walls 113 provided upright on the light blocking film 106. Specifically, in the solid state imaging device of the prior art shown in FIG. 1, the top edges of the light blocking walls 913 are lower than the lower face of the color filter 910, whereas in the solid state imaging device 1 of the present embodiment shown in FIG. 3, the top edges of the light blocking walls 113 are positioned higher than the upper faces of the color filters 110.

Due to employing the light blocking walls 113 having the above structure, in the solid state imaging device 1 of the present embodiment, the imaging pixels 11 are optically separated from each other from directly below the top lenses 112. According to this structure, light incidenting on the color filters 110 does not readily leak into an adjacent imaging pixel 11. Specifically, the solid state imaging device 1 enables reliably suppressing color mixing that occurs due to stray light, improving sensitivity, and obtaining high smear resistance.

Note that, as shown in FIG. 3, although the thicknesses of the color filters 110 differ according to the color of the corresponding imaging pixel 11, the top edges of the light blocking walls 113 in the solid state imaging device 1 are positioned higher than the upper faces of the color filters 110 in all of the imaging pixels 11.

4. Manufacturing Method

A manufacturing method for the solid state imaging device 1 is described below. The following description focuses on a formation process for the light blocking walls 113 with reference to FIGS. 4A to 4D and FIGS. 5A to 5C.

Figure 4A:
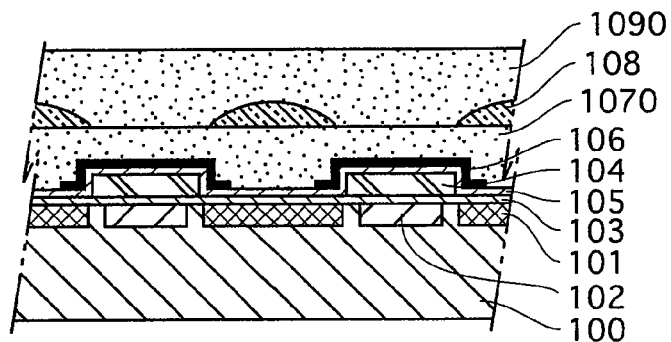
FIGS. 4A to 4D show steps in a manufacturing process for the imaging pixel 11, in a manufacturing process for the solid state imaging device 1.

As shown in FIG. 4A, ion implantation etc. is performed on the semiconductor substrate 100 to form photodiodes 101 and transfer channels 102. Next, the gate oxide film 103 is formed on the surface of the semiconductor substrate 100 with use of a thermal oxidation method or a CVD (Chemical Vapor Deposition) method. Note that the gate oxide film 103 can have a single-layer oxide film structure or a multilayer structure including an oxide film, a nitride film, etc.

Next, the PS gates 104 are formed using, for example, a CVD method or photolithography and etching processing.

Thereafter, the interlayer insulation film 105 is formed using a thermal oxidation method, CVD method, or the like, and the light blocking film 106 composed of tungsten (W) etc. is formed on the interlayer insulation film 105. During the formation of the light blocking film 106, apertures are provided in portions thereof that are above the photodiodes 101.

Next, a reflow film composed of BPSG (Boron-Phospho-Silicate-Glass) etc. is provided, and a preliminary insulation film 1070 is formed by reflow, CMP (Chemical Mechanical Polishing) or the like. Thereafter, intra-layer lenses 108 are formed at sites above the photodiodes 101. The intralyer lenses 108 are formed by providing a plasma nitride film (P-SiN) etc. and performing photolithography and etching processing etc. A preliminary planarizing film 1090 is formed so as to cover the intralyer lenses 108. The preliminary planarizing film 1090 is also formed by performing reflow with the use of BPSG, CMP, or another method.

Figure 4B:
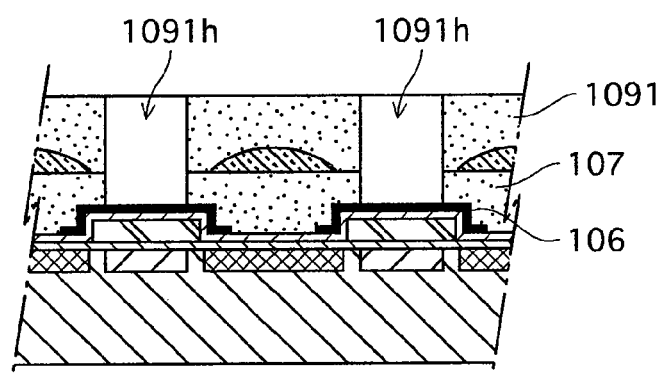

As shown in FIG. 4B, grooves 1091h are formed in the preliminary insulation film 1070 and preliminary planarizing film 1090 at positions above the light blocking film 106. The grooves 1091h have a width of approximately 0.5 [μm], and are formed by performing photolithography and dry etching processing.

Figure 4C:
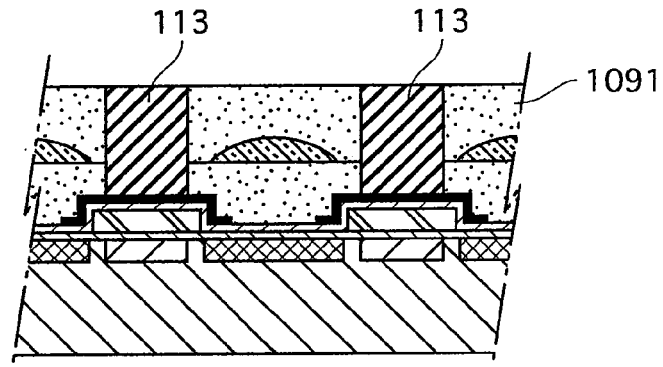

As shown in FIG. 4C, the grooves 1091h are filled with tungsten (W) and aluminum (Al) by a sputtering method or CVD method. The W and Al above the preliminary planarizing film 1091 is then removed using etch back processing, CMP, or the like.

Figure 4D:
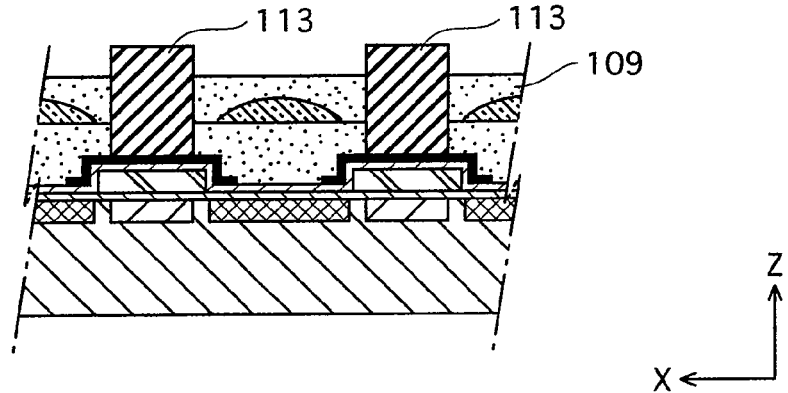

As shown in FIG. 4D, photolithography and dry etching processing is used to etch the preliminary planarizing film 1091 down to a desired depth (a depth greater than or equal to a maximum thickness of color filters 110 to be formed later).

Figure 5A:
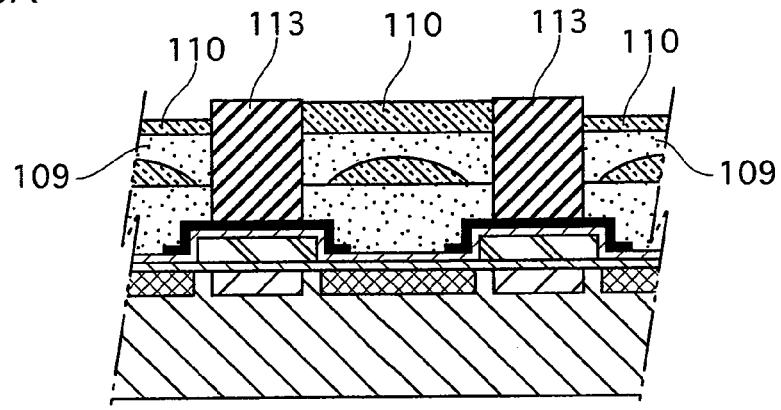
FIGS. 5A to 5C shows steps in the manufacturing process for the imaging pixel 11, in the manufacturing process for the solid state imaging device 1.

As shown in FIG. 5A, color filters 110 are formed on the surface of the planarizing film 109 obtained by etching down the preliminary planarizing film 1091. The color filters 110 are formed by applying color resist, performing a dyeing method, or the like. As previously mentioned, in all of the imaging pixels 11, the top faces of the color filters 110 are at the same level or lower than the top edges of the light blocking walls 113.

Figure 5B:
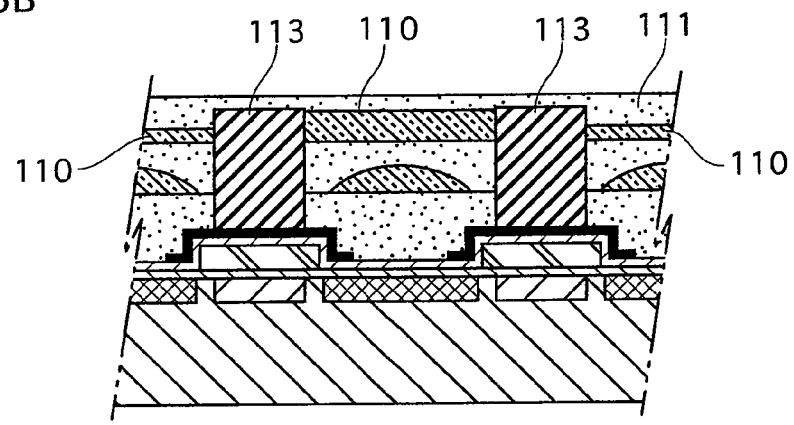

As shown in FIG. 5B, the planarizing film 111 is formed on the light blocking walls 113 and the color filters 110. The planarizing film 111 is also formed by performing photolithography and dry etching processing. Note that the planarizing film 111 can be formed directly under the color filters 110. Also, the planarizing film 111 can be formed using a material such as translucent resin, and can have a single-layer structure. Alternatively, the planarizing film 111 can have a stacked structure including a layer composed of translucent resin and an insulation film.

Figure 5C:
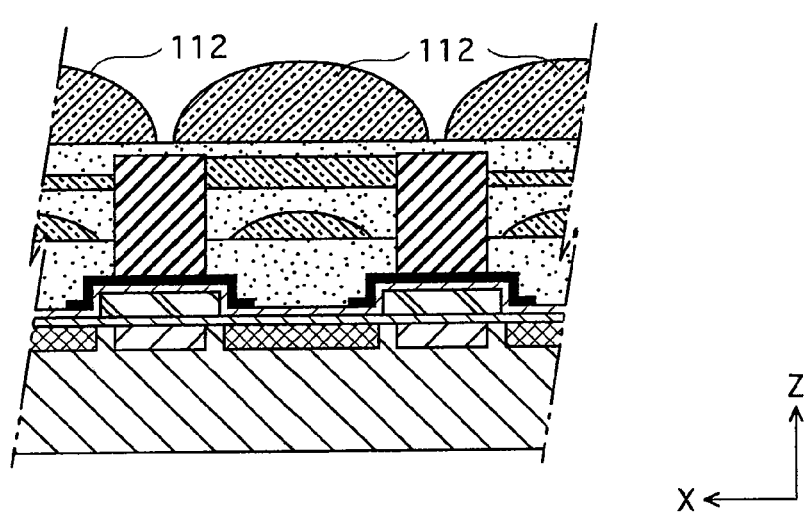

As shown in FIG. 5C, top lenses 112 are formed on the face of the planarizing film 111 at positions above the photodiodes 101, thus completing the solid state imaging device 1. The top lenses 112 are formed using hot-melt resin or a resist/thermal-reflow/transfer process.

Embodiment 2

1. Structure of Imaging Pixels and Vertical CCDs

Figure 6:
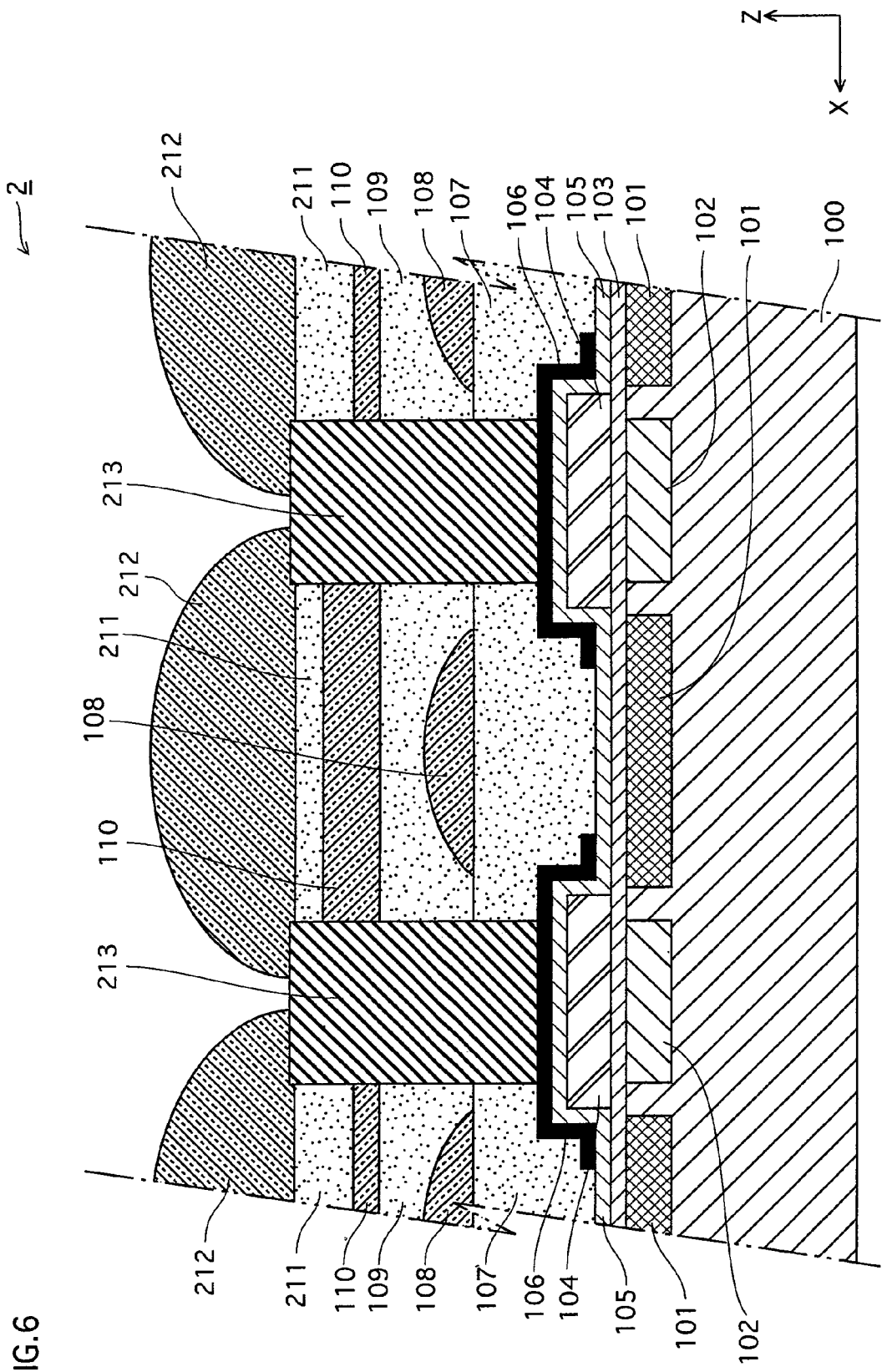
FIG. 6 is a cross-sectional view diagrammatically showing a structure of an imaging pixel in a solid state imaging device 2 pertaining to embodiment 2.

The following describes the structure of a solid state imaging device 2 pertaining to embodiment 2 with reference to FIG. 6. The solid state imaging device 2 of the present embodiment differs from the solid state imaging device 1 of embodiment 1 with respect to the position of the top edges of light blocking walls 213 and the configuration of portions in the vicinity. The following description focuses on these differences.

As shown in FIG. 6, in the solid state imaging device 2, the top edges of the light blocking walls 213 are higher than the top faces of planarizing films 211. Specifically, in the solid state imaging device 2, the top edges of the light blocking walls 213 are in contact with top lenses 212, and the planarizing films 211 in the imaging pixels are separated from each other by the light blocking walls 213. A description of other portions of the structure has been omitted due to being the same as the solid state imaging device 1 of embodiment 1.

2. Superiority

In the solid state imaging device 2, the top edges of the light blocking walls 213 are higher than the upper faces of the planarizing films 211, thereby making stray light even less of a problem than in the solid state imaging device 1. Specifically, in the solid state imaging device 1 of embodiment 1, the possibility of stray light remains due to the planarizing film 111 that is formed on the color filters 110.

However, in the solid state imaging device 2 of the present embodiment, the top edges of the light blocking walls 213 are higher than in the solid state imaging device 1, thereby further suppressing problems due to stray light. The solid state imaging device 2 therefore more reliably prevents color mixing.

3. Manufacturing Method

Figure 7A:
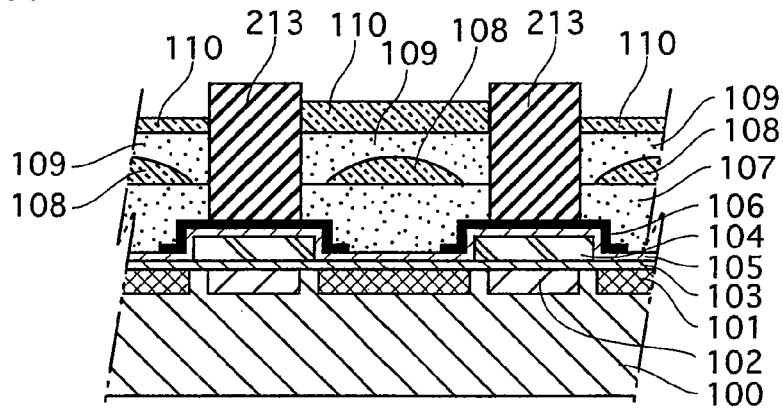
FIGS. 7A to 7C show steps in a manufacturing processing for the imaging pixel, in a manufacturing process for the solid state imaging device 2.
Figure 7B:
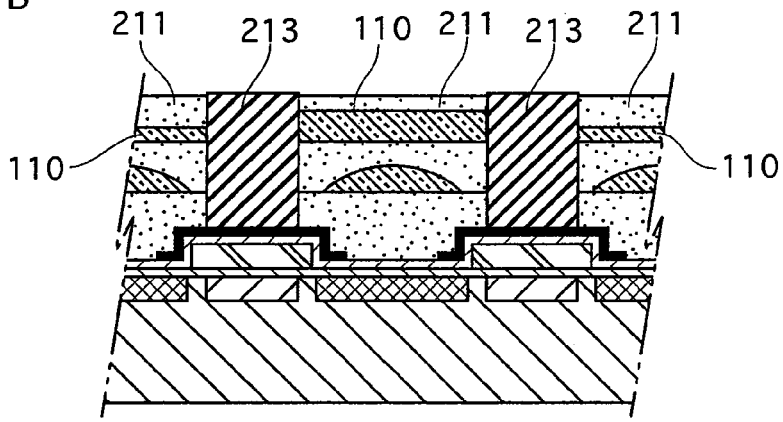
Figure 7C:
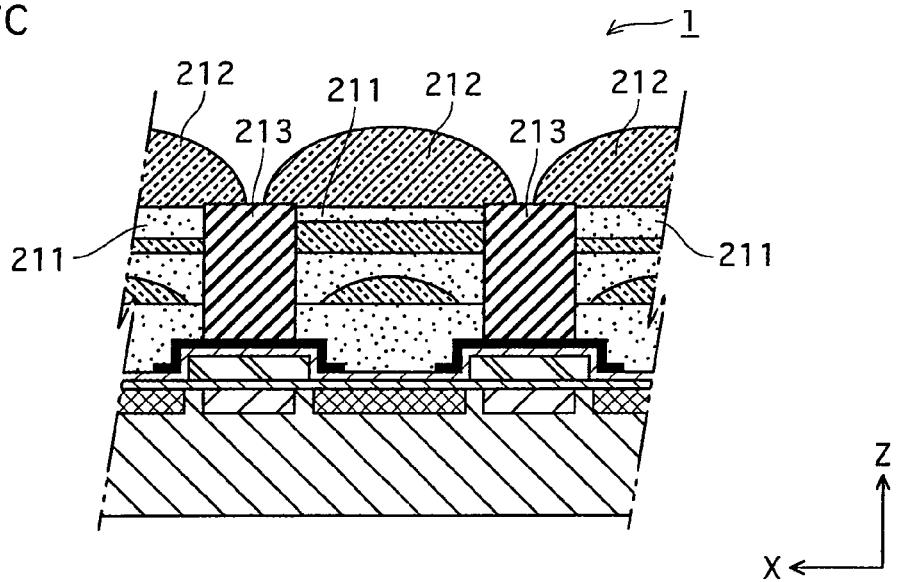

The following describes a manufacturing method for the solid state imaging device 2 with reference to FIGS. 7A to 7C. Note that a description and drawings of the steps of FIGS. 4A to 4D have been omitted since there are basically no changes from embodiment 1.

As shown in FIG. 7A, color filters 110 are formed between adjacent light blocking walls 213 using the same method as in embodiment 1. Since the top edges of the light blocking walls 213 are higher than the top edges of the light blocking walls 113 in embodiment 1, the upper faces of the color filters 110 of the present embodiment are lower than the top edges of the light blocking walls 213.

As shown in FIG. 7B, the planarizing films 211 are formed using the same method as in embodiment 1. In this case, due to the difference from embodiment 1, the upper faces of the planarizing films 211 are higher than or equal with the top edges of the light blocking walls 213.

As shown in FIG. 7C, top lenses 212 are formed on the planarizing films 211 and the light blocking walls 213, thus completing the solid state imaging device 2.

Embodiment 3

1. Structure of Imaging Pixels and Vertical CCDs

Figure 8:
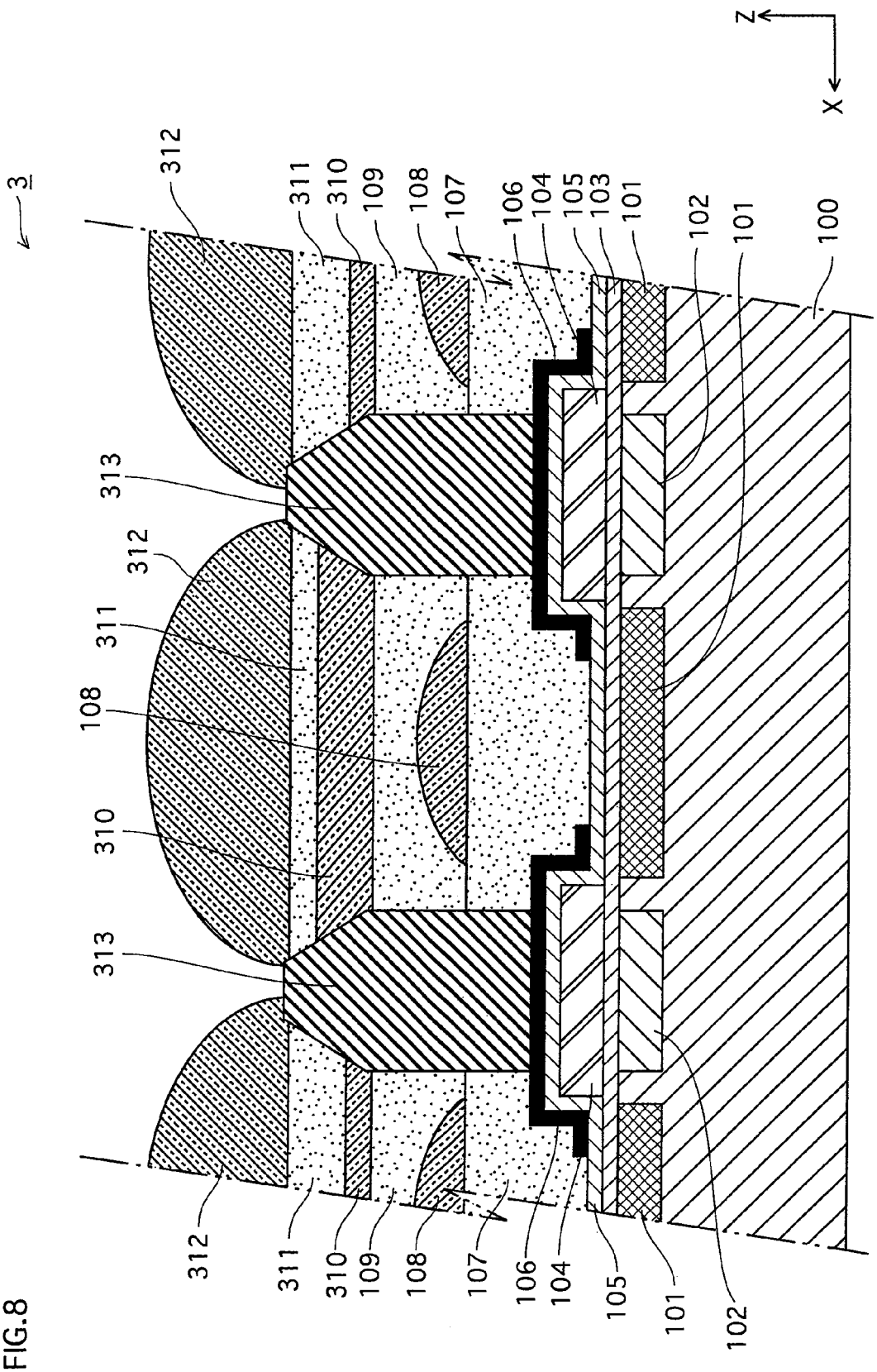
FIG. 8 is a cross-sectional view diagrammatically showing a structure of an imaging pixel in a solid state imaging device 3 pertaining to embodiment 3.

The following describes the structure of a solid state imaging device 3 pertaining to embodiment 3 with reference to FIG. 8. The solid state imaging device 3 differs from the solid state imaging device 2 only with respect to the configuration of the top edge portions of light blocking walls 313.

As shown in FIG. 8, in the solid state imaging device 3, the configuration of the top edge portions of the light blocking walls 313 is such that from above the lower faces of color filters 310, the cross-sectional area of the top edge portions decreases in the upward direction. More specifically, the top edge portions of the light blocking walls 313 have a trapezoidal shape. The trapezoidal portion may specifically be such that, for example, the taper angle of the lateral faces is 1[°] to 30[°], or the top edge of the trapezoidal portion fits between adjacent top lenses 312.

The light blocking walls 313 of the solid state imaging device 3 can be formed by setting the width of the resist mask used when etching the preliminary planarizing film to be smaller than the thickness of the light blocking walls.

2. Superiority

In the solid state imaging device 3, the wall thickness of the light blocking walls 313 decreases in the upward direction of the Z axis. Accordingly, light that incidents on the top lenses 312 is guided toward the photodiodes 101 in the imaging pixels by the tapered faces of the light blocking walls 313. Here, the light blocking walls 313 reflect at least visible light due to being composed of W, TiN, Ti, Al, or the like.

Accordingly, the solid state imaging device 3 of the present embodiment is highly sensitive since light that incidents on the top lenses 312 is reliably guided toward the photodiodes 101.

Embodiment 4

1. Structure of Imaging Pixels and Vertical CCDs

Figure 9:
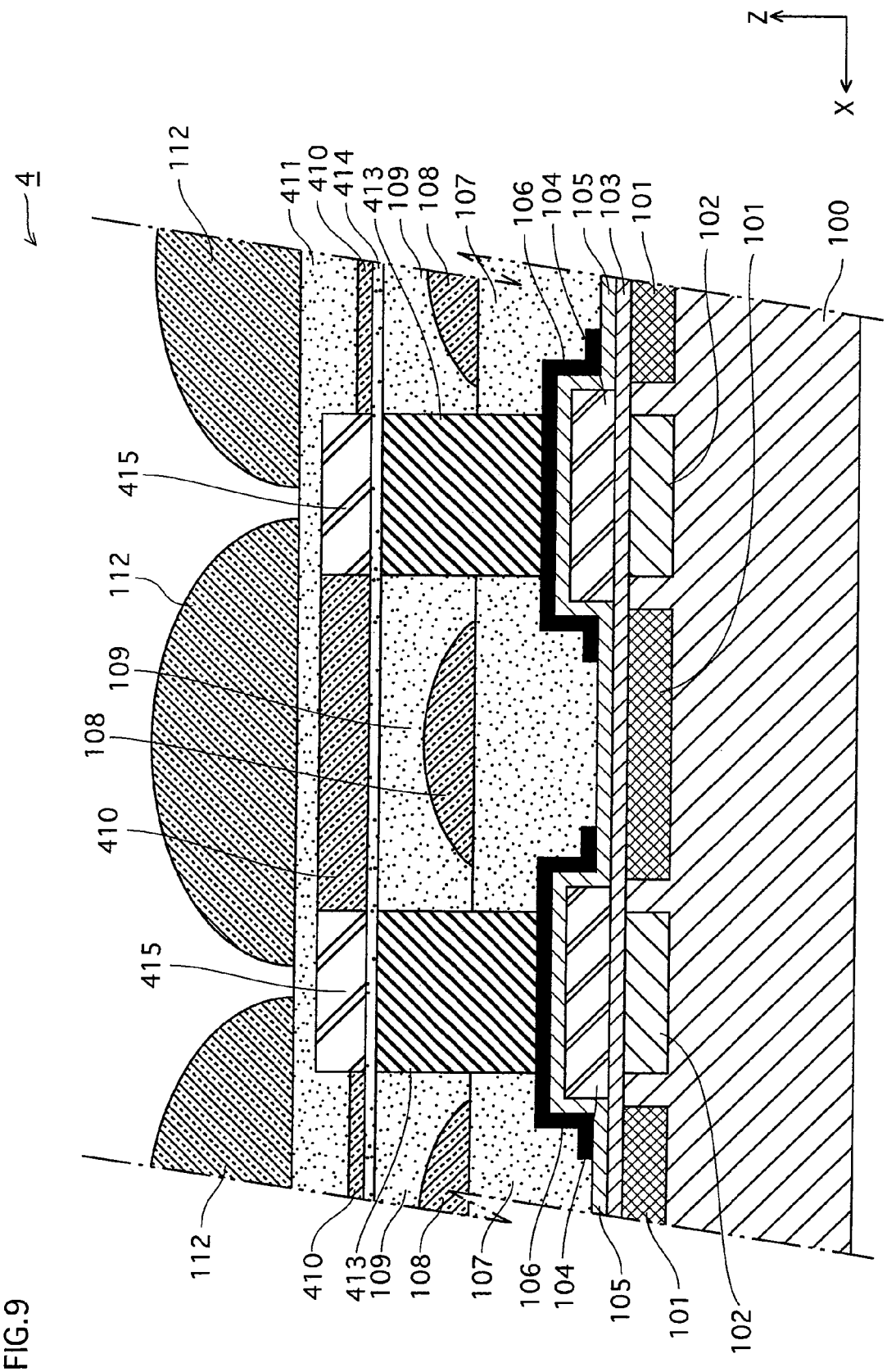
FIG. 9 is a cross-sectional view diagrammatically showing a structure of an imaging pixel in a solid state imaging device 4 pertaining to embodiment 4.

The following describes the structure of a solid state imaging device 4 pertaining to embodiment 4 with reference to FIG. 9. The solid state imaging device 4 differs from the solid state imaging device 1 only with respect to light blocking walls 413 and color filters 410.

As shown in FIG. 9, in the solid state imaging device 4 of the present embodiment, the top edges of the light blocking walls 413 provided upright on the light blocking film 106 are in substantially the same plane as the upper faces of the planarizing films 109. A planarizing film 414 has been formed on the light blocking walls 413 and the planarizing films 109, color filters 410 have been formed on the planarizing film 414 over the planarizing films 109, and intra-filter light blocking elements 415 have been formed on the planarizing film 414 over the light blocking walls 413.

Similarly to embodiments 1, 2, and 3, the thicknesses of the color filters 410 have been set in accordance with the wavelength band of light to be transmitted to the corresponding imaging pixel. However, the intra-filter light blocking elements 415 are constituted from black filters and have a film thickness equal to the thickness portion of the color filter 410.

A planarizing film 411 and top lenses 112 are formed in the stated order on the color filters 410 and the intra-filter light blocking elements 415. A description of the structure of the planarizing film 411 and top lenses 112 has been omitted due to being the same as the solid state imaging device 1 of embodiment 1.

Note that film thickness of the planarizing film 414 in the solid state imaging device 4 is set to be thinner than the visible wavelength band of light, thereby preventing light passing through the planarizing film 414 from leaking into an adjacent imaging pixel.

2. Superiority

The solid state imaging device 4 of the present embodiment includes the light blocking film 106, the light blocking walls 413, and the intra-filter light blocking elements 415 as light blocking portions. Also, the upper faces of the intra-filter light blocking elements 415 are in substantially the same plane as the upper face of the thickest color filter 410. Accordingly, the solid state imaging device 4 also prevents problems due to stray light entering an adjacent imaging pixel.

Therefore, the solid state imaging device 4 is also highly sensitive and resistant to smearing.

Note that the intra-filter light blocking elements 415 can have a tapered configuration, similarly to the top edge portions of the light blocking walls 313 shown in FIG. 8.

3. Manufacturing Method

The following describes a manufacturing method for the solid state imaging device 4 with reference to FIGS. 10A to 10C and FIGS. 11A to 11B. Note that a description and drawings of the steps of FIGS. 4A to 4C have been omitted since there are basically no changes from embodiment 1.

Figure 10A:
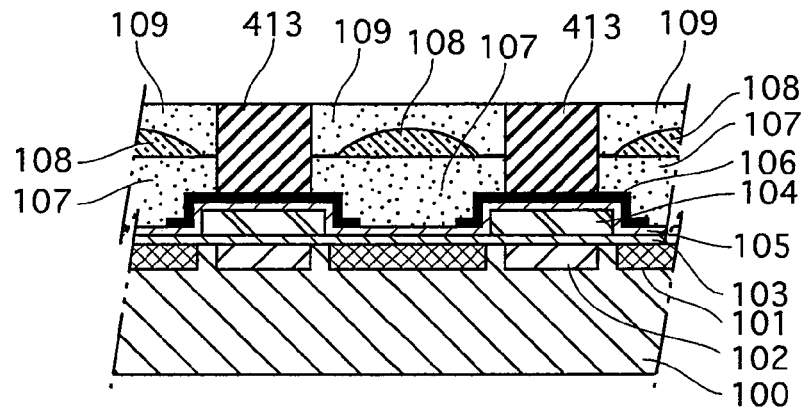
FIGS. 10A to 10C show steps in a manufacturing processing for the imaging pixel, in a manufacturing process for the solid state imaging device 4.

As shown in FIG. 10A, light blocking walls 413 are formed using basically the same method as in the manufacturing method for the solid state imaging device 1 of embodiment 1. However, in the manufacturing method for the solid state imaging device 4 of the present embodiment, the height of the light blocking walls 413 is set to be lower than in embodiment 1.

Figure 10B:
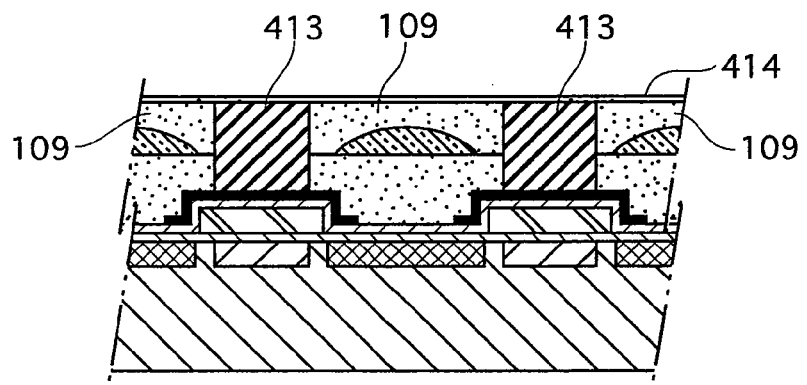

As shown in FIG. 10B, the planarizing film 414 is formed on the light blocking walls 413 and the planarizing films 109. The planarizing film 414 is composed of an insulating material and has a film thickness of, for example, 50 to 100 [nm]. Specifically, the film thickness of the planarizing film 414 is smaller than the visible wavelength band of light (360 to 830 [nm]).

Figure 10C:
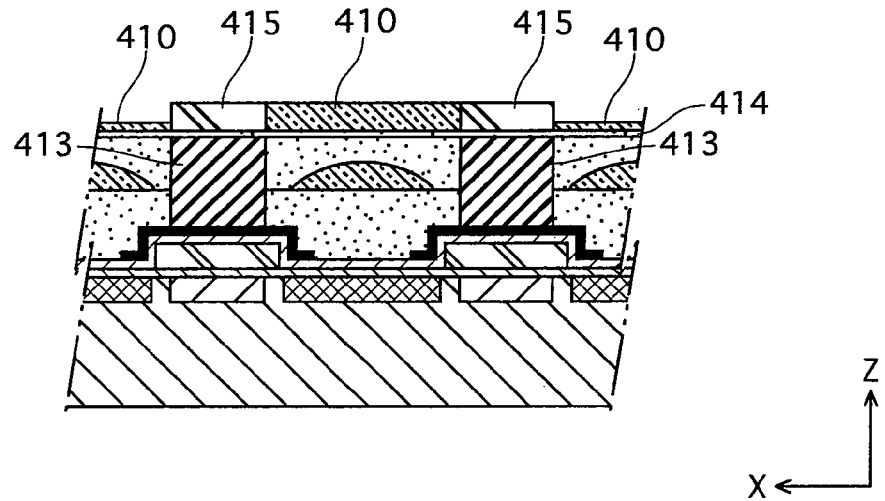

Next, as shown in FIG. 10C, intra-filter light blocking elements 415 are formed on the planarizing film 414 at positions above the light blocking walls 413, and color filters 410 are formed on remaining portions of the planarizing film 414. The thickness of the color filters 410 is in accordance with the corresponding imaging pixel. Here, the intra-layer light blocking elements 415 are constituted from black filters or are dyed black using a dyeing method.

As shown in FIG. 11A, the planarizing film 411 is formed so as to cover the color filters 410 and the intra-filter light blocking elements 415. Note that in the present embodiment, the planarizing film 411 can have a single-layer structure composed of translucent resin, or can have a multilayer structure composed of translucent resin and an insulator.

As shown in FIG. 11B, top lenses 112 are formed on the planarizing film 411 in correspondence with the photodiodes 101, thus completing the solid state imaging device 4.

Embodiment 5

1. Structure

Figure 12:
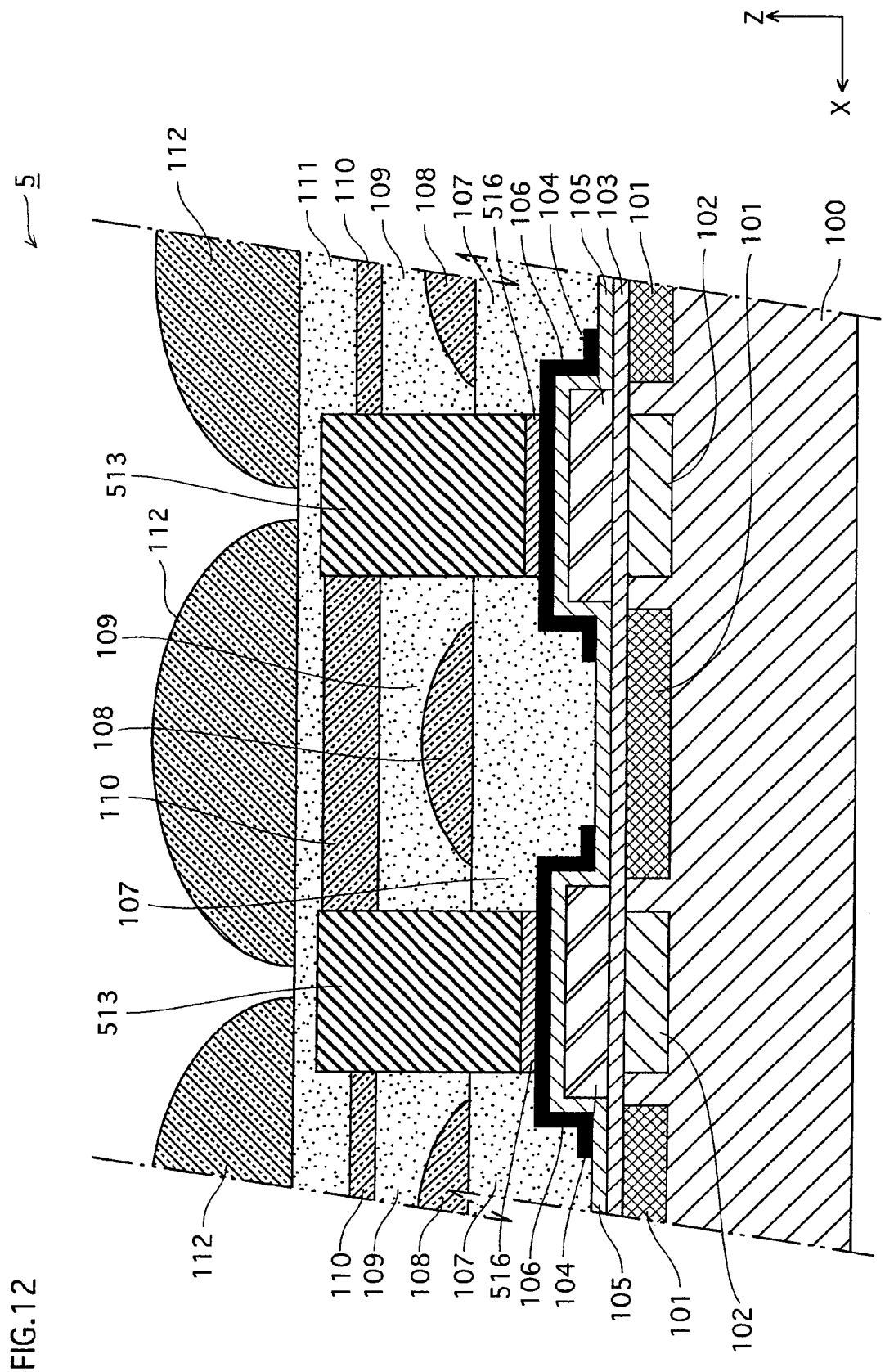
FIG. 12 is a cross-sectional view diagrammatically showing a structure of an imaging pixel in a solid state imaging device 5 pertaining to embodiment 5.

The following describes the structure of a solid state imaging device 5 pertaining to embodiment 5 with reference to FIG. 12. In FIG. 12, the same reference numbers have been given to portions that are the same as in the solid state imaging device 1 of embodiment 1, and descriptions of such portions have been omitted.

As shown in FIG. 12, the solid state imaging device 5 differs from the solid state imaging device 1 of embodiment 1 in that insulation films 516 are provided between the light blocking film 106 and light blocking walls 513. Also, although the height of the light blocking walls 513 in the Z axis direction is smaller by an amount corresponding to the film thickness of the insulation films 516, the top edges of the light blocking walls 513 are substantially equal to or slightly higher than the upper faces of the thickest color filters 110.

All other portions of the solid state imaging device 5 are the same as the solid state imaging device 1.

2. Superiority

In the solid state imaging device 5, the insulation films 516 have been provided between the light blocking film 106 and the light blocking walls 513, thereby suppressing the transmission of stress generated in the light blocking walls 513 to the semiconductor substrate 100 via the light blocking film 106. Accordingly, the solid state imaging device 5 of the present embodiment has the superior advantages of the solid state imaging device 1 of embodiment 1, and additionally enables effectively suppressing image degradation due to white spots etc.

3. Manufacturing Method

Figure 13A:
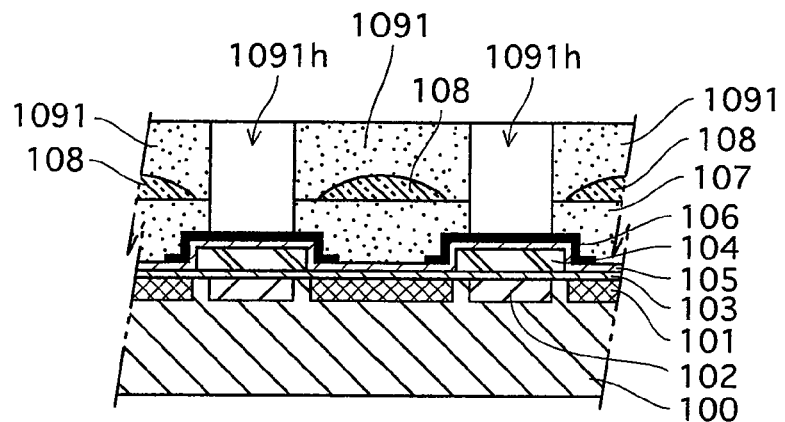
FIGS. 13A to 13C show steps in a manufacturing processing for the imaging pixel, in a manufacturing process for the solid state imaging device 5.
Figure 13B:
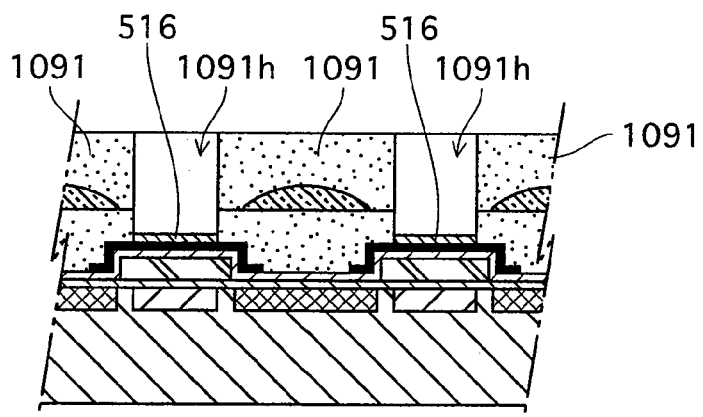
Figure 13C:
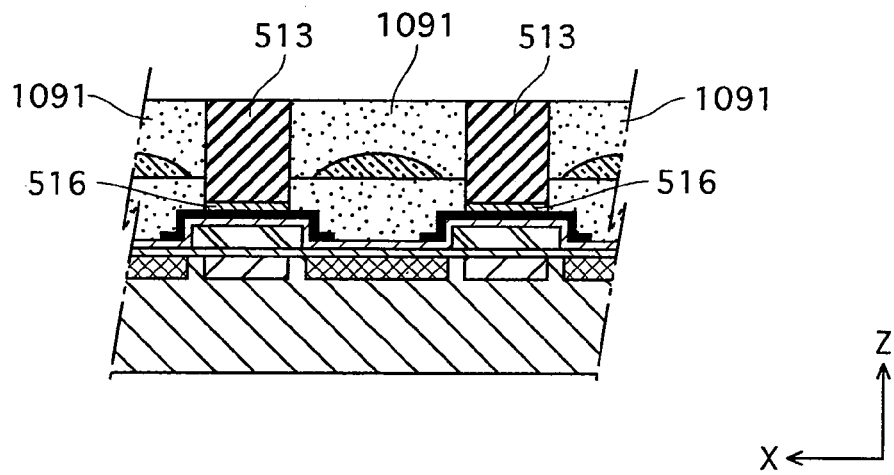

The following describes a manufacturing method for the solid state imaging device 5 with reference to FIGS. 13A to 13C. Note that the condition shown in FIG. 13A corresponds to the condition shown in FIG. 4B.

As shown in FIG. 13A, grooves 1091*h* are formed in the preliminary planarizing film 1091 and the insulation film 107 at positions above the light blocking film 106, using the same method as in embodiment 1.

Next, as shown in FIG. 13B, insulation films 516 are formed in the bottom portions of the grooves 1091*h*. Note that in the case of using a CVD method etc. when forming the insulation films 516, insulation films are also formed on the side walls of the grooves 1091*h*, thereby enabling reducing the film thickness of the light blocking walls 513. The inclusion of light blocking walls 513 that have a reduced film thickness enables improving the sensitivity of the solid state imaging device 5.

Also, as shown in FIG. 13C, a metal material such as W, TiN, Ti, Al, or the like is filled into the grooves 1091*h* over the insulation films 516, thereby forming the light blocking walls 513. Thereafter, the same steps as shown in FIG. 4D to FIG. 5C are performed, thus completing the solid state imaging device 5.

Embodiment 6

Figure 14:
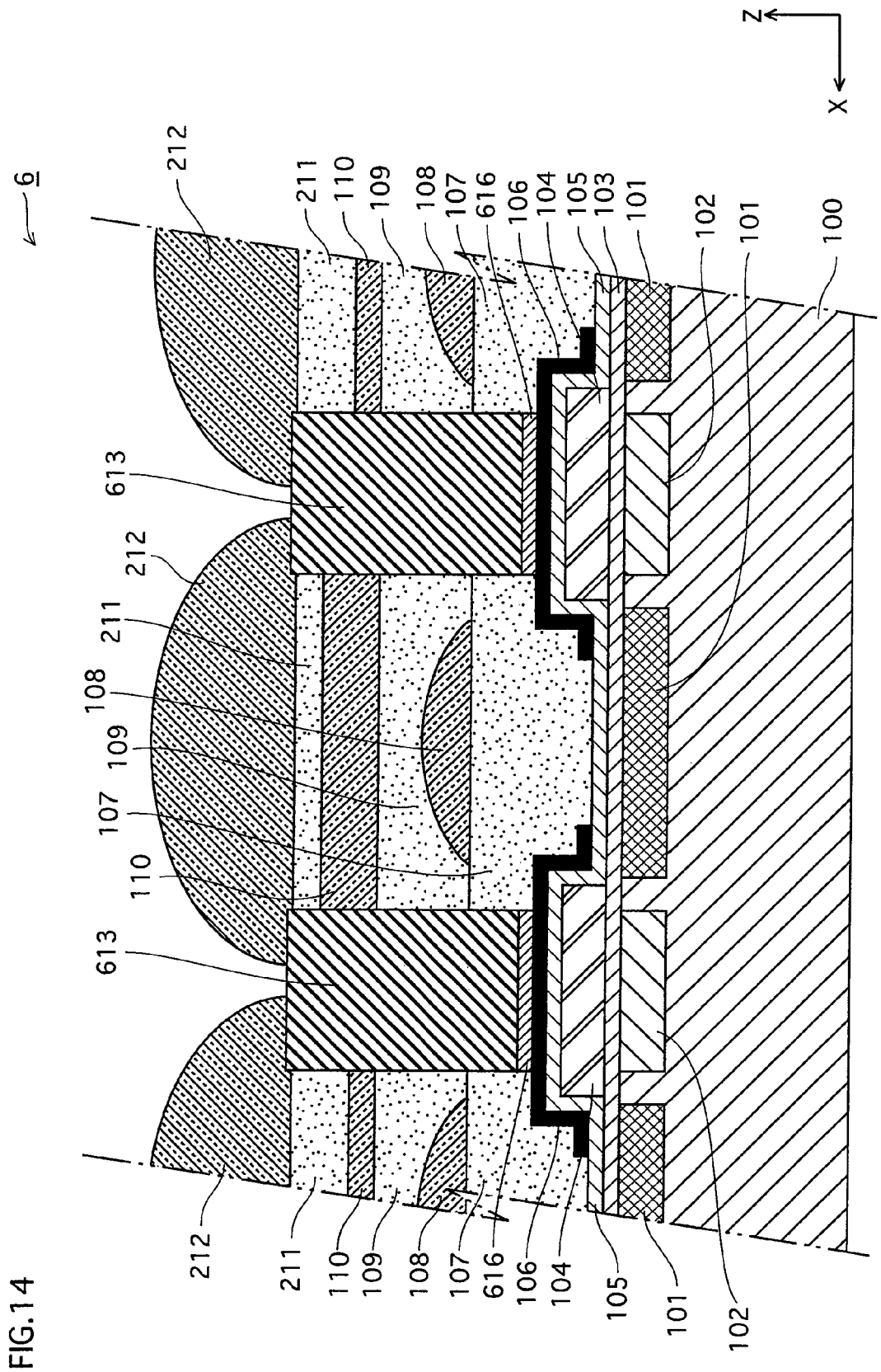
FIG. 14 is a cross-sectional view diagrammatically showing a structure of an imaging pixel in a solid state imaging device 6 pertaining to embodiment 6.

The following describes the structure of a solid state imaging device 6 pertaining to embodiment 6 with reference to FIG. 14. In FIG. 14, the same reference numbers have been given to portions that are the same as in the solid state imaging device 2 of embodiment 2, and descriptions of such portions have been omitted.

As shown in FIG. 14, the solid state imaging device 6 differs from the solid state imaging device 2 of embodiment 2 in that insulation films 616 are provided between the light blocking film 106 and light blocking walls 613. Also, although the height of the light blocking walls 613 in the Z axis direction is smaller by an amount corresponding to the film thickness of the insulation films 616, the top edges of the light blocking walls 613 are substantially equal to or slightly higher than the upper faces of the planarizing films 211.

All other portions of the solid state imaging device 6 are the same as the solid state imaging device 2.

Similarly to the solid state imaging device 5, in the solid state imaging device 6, the insulation films 616 have been provided between the light blocking film 106 and the light blocking walls 613, thereby suppressing the transmission of stress generated in the light blocking walls 613 to the semiconductor substrate 100 via the light blocking film 106. Accordingly, the solid state imaging device 6 of the present embodiment has the superior advantages of the solid state imaging device 2 of embodiment 2, and additionally enables effectively suppressing image degradation due to white spots etc.

Embodiment 7

Figure 15:
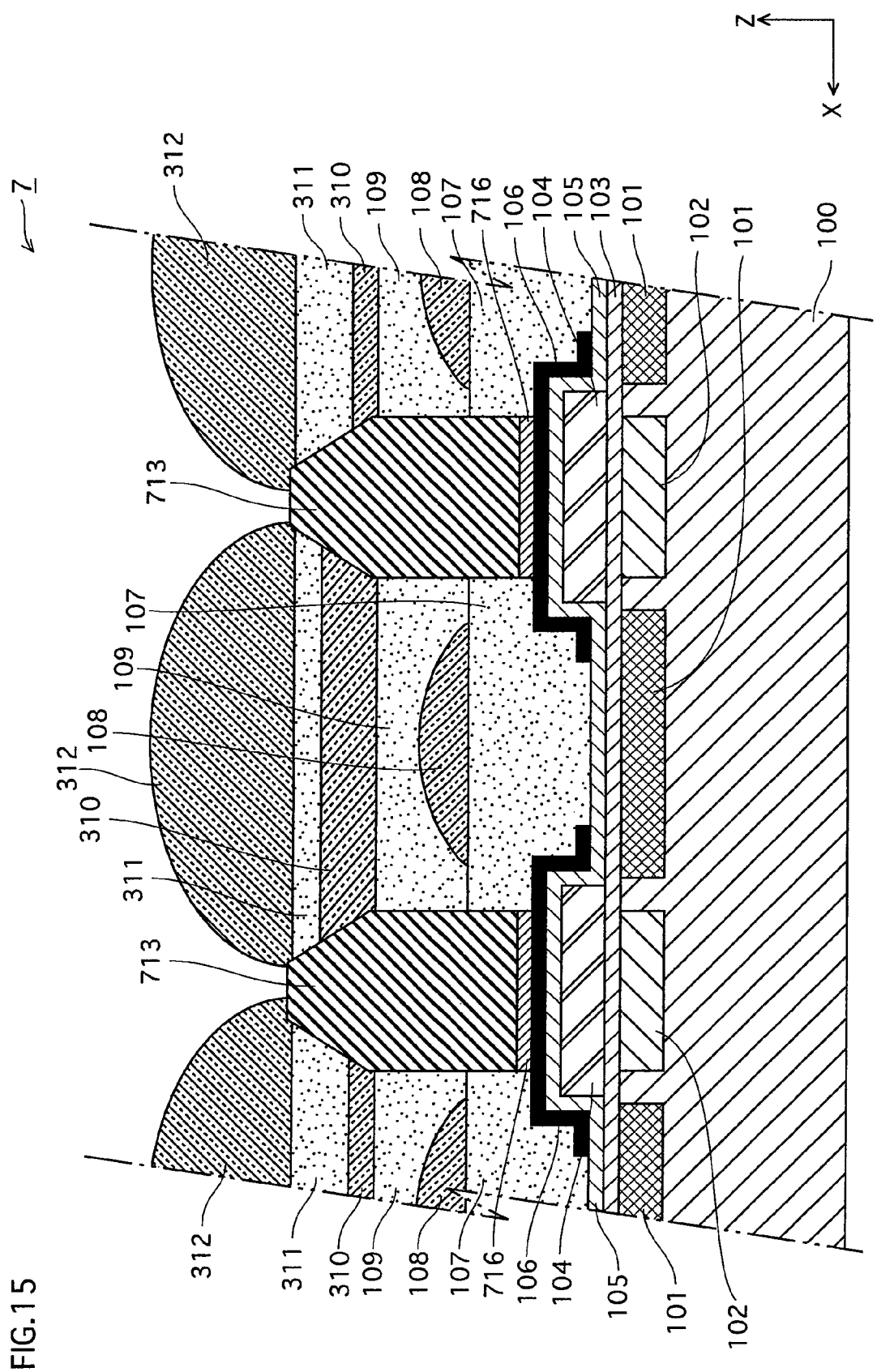
FIG. 15 is a cross-sectional view diagrammatically showing a structure of an imaging pixel in a solid state imaging device 7 pertaining to embodiment 7.

The following describes the structure of a solid state imaging device 7 pertaining to embodiment 7 with reference to FIG. 15. In FIG. 15, the same reference numbers have been given to portions that are the same as in the solid state imaging device 3 of embodiment 3, and descriptions of such portions have been omitted.

As shown in FIG. 15, the solid state imaging device 7 differs from the solid state imaging device 3 of embodiment 3 in that insulation films 716 are provided between the light blocking film 106 and light blocking walls 713. Also, although the height of the light blocking walls 713 in the Z axis direction is smaller by an amount corresponding to the film thickness of the insulation films 716, the top edges of the light blocking walls 713 are substantially equal in height to or slightly higher than the upper faces of the planarizing films 311. Also, the top edge portions of the light blocking walls 713 of the solid state imaging device 7 have a tapered shape.

All other portions of the solid state imaging device 7 are the same as the solid state imaging device 3.

Similarly to the solid state imaging devices 5 and 6, in the solid state imaging device 7, the insulation films 716 have been provided between the light blocking film 106 and the light blocking walls 713, thereby suppressing the transmission of stress generated in the light blocking walls 713 to the semiconductor substrate 100 via the light blocking film 106. Accordingly, the solid state imaging device 7 of the present embodiment has the superior advantages of the solid state imaging device 3 of embodiment 3, and additionally enables effectively suppressing image degradation due to white spots etc.

Embodiment 8

Figure 16:
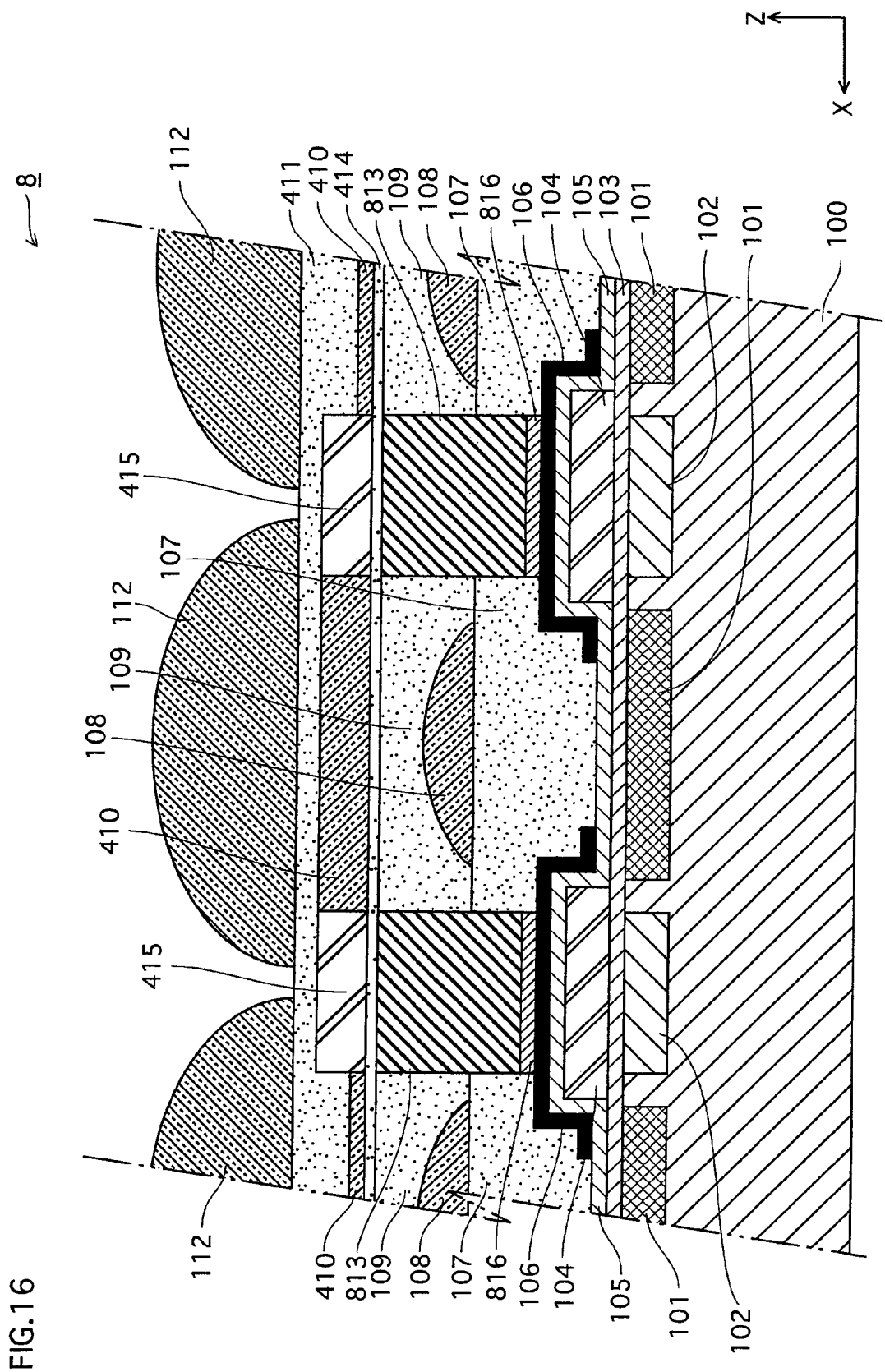
FIG. 16 is a cross-sectional view diagrammatically showing a structure of an imaging pixel in a solid state imaging device 8 pertaining to embodiment 8.

The following describes the structure of a solid state imaging device 8 pertaining to embodiment 8 with reference to FIG. 16. In FIG. 16, the same reference numbers have been given to portions that are the same as in the solid state imaging device 4 of embodiment 4, and descriptions of such portions have been omitted.

As shown in FIG. 16, the solid state imaging device 8 differs from the solid state imaging device 4 of embodiment 4 in that insulation films 816 are provided between the light blocking film 106 and light blocking walls 813. Also, the intra-filter light blocking elements 415 are formed over the light blocking walls 813 via the planarizing film 414, and the upper faces of the intra-filter light blocking elements 415 are in substantially the same plane as the uppermost face of the color filters 410 having the highest film thickness. In the present embodiment, the planarizing film 414 has a film thickness of 50 to 100 [nm], and therefore light in the visible wavelength band does not leak from the planarizing film 414 into adjacent imaging pixels.

All other portions of the solid state imaging device 8 are the same as the solid state imaging device 4.

Similarly to the solid state imaging devices 5, 6 and 7, in the solid state imaging device 8, the insulation films 816 have been provided between the light blocking film 106 and the light blocking walls 813, thereby suppressing the transmission of stress generated in the light blocking walls 813 to the semiconductor substrate 100 via the light blocking film 106. Accordingly, the -solid state imaging device 8 of the present embodiment has the superior advantages of the solid state imaging device 4 of embodiment 4, and additionally enables effectively suppressing image degradation due to white spots etc.

Supplementary Remarks

Although described using the examples of the CCD type solid state imaging devices 1 to 8 in embodiments 1 to 8, the present invention is not limited to a CCD type solid state imaging device. The present invention is also applicable to a MOS type solid state imaging device. Specifically, provided that insulation is maintained between the wiring layers formed between the surface of the semiconductor substrate and the top lenses etc., light blocking walls that are higher than or equal in height to the color filters can be provided in an MOS type solid state imaging device, in the same way as the CCD type solid state imaging device. The same effects as described above can be achieved in this case as well.

Also, although the intra-layer lenses 108 are convex in the upward direction in embodiments 1 to 8, the present invention should not be limited to this. The intra-layer lenses may be convex in the downward direction, or convex in both the upward and downward directions.

Also, the materials constituting the light blocking walls 113 to 813 in embodiments 1 to 8 are merely examples, and the present invention should not be limited to these. For example, the light blocking walls 113 to 813 may be composed of a resin material and one or more of W, TiN, Ti, and Al. However, it is desirable to use an inorganic material.

Also, the intra-filter light blocking elements 415 of embodiments 4 and 8 may be constituted from any material that suppresses or prevents the transmission of light. However, it is desirable to use organic materials due to the relationship with the material used to form the color filters.

Also, in embodiments 4 and 8, at least the planarizing film 414 between the inorganic light blocking walls and the black organic layers may be omitted in order to improve the blockage of light from adjacent imaging pixels.

Although the present invention has been fully described by way of examples with reference to the accompanying drawings, it is to be noted that various changes and modifications will be apparent to those skilled in the art. Therefore, unless such changes and modifications depart from the scope of the present invention, they should be construed as being included therein.

What is claimed is:

1. A solid state imaging device in which a plurality of imaging pixels are arranged two-dimensionally along a main face of a semiconductor substrate with gaps between adjacent imaging pixels, the solid state imaging device comprising:
    a plurality of light receiving portions that performs photoelectric conversion and have been formed in one-to-one correspondence with the plurality of imaging pixels;
    a plurality of color filters that have been formed in one-to-one correspondence with the plurality of imaging pixels and are disposed above the plurality of light receiving portions;
    a plurality of light blocking portions that blocks light, each being provided between a different pair of adjacent imaging pixels and having been formed on the main face of the semiconductor substrate to a height in a thickness direction of the semiconductor substrate that is greater than or substantially equal to top edges of the plurality of color filters; and
    a plurality of top lenses, each having been formed above a different one of the color filters in the plurality of imaging pixels, wherein
    each of the light blocking portions includes a part whose cross-sectional area gradually decreases in an upward direction with respect to the thickness direction of the semiconductor substrate.

2. The solid state imaging device of claim 1, further comprising:
    a plurality of transfer channels, each having been formed between a different pair of adjacent light receiving portions on the main face of the semiconductor substrate and in close proximity to one of the adjacent light receiving portions;
    a plurality of transfer electrodes that have been formed on the main face of the semiconductor substrate in one-to-one correspondence with the plurality of transfer channels;
    a light blocking film that has been formed above the main face of the semiconductor substrate so as to cover upper faces and lateral faces of the plurality of transfer electrodes; and
    a plurality of light blocking walls that have been provided on or above the light blocking film and standing upright in the thickness direction of the semiconductor substrate, wherein
    each light blocking portion includes the light blocking film and a different one of the light blocking walls.

3. The solid state imaging device of claim 2, wherein the plurality of light blocking walls are composed of an inorganic material.

4. The solid state imaging device of claim 2, wherein the plurality of light blocking walls are composed of one or more materials selected from the group consisting of W, TiN, Ti, and Al.

5. The solid state imaging device of claim 2, wherein the plurality of light blocking walls are composed of an inorganic material and an organic material.

6. The solid state imaging device of claim 2, wherein the plurality of light blocking walls are composed of a resin material and one or more materials selected from the group consisting of W, TiN, Ti, and Al.

7. The solid state imaging device of claim 2, wherein the light blocking film is electrically insulated from the plurality of light blocking walls.

8. The solid state imaging device of claim 1, further comprising:
    a plurality of intra-layer lenses, each having been formed between the light receiving portion and the color filter of a different one of the imaging pixels.

9. The solid state imaging device of claim 8, wherein each of the intra-layer lenses is convex in an upward direction or a downward direction with respect to the thickness direction of the semiconductor substrate, or convex in both the upward direction and the downward direction.

10. The solid state imaging device of claim 1, wherein top edges of the light blocking portions are positioned at or in a proximity of bottom edges of the plurality of top lenses.

11. The solid state imaging device of claim 1, further comprising:
    a planarizing film that has been formed between (i) a first area of each light blocking portion that is substantially equal in height to an area in which the plurality of color filters have been formed and (ii) a second area of each light blocking portion that is below the first area, wherein
    a thickness of the planarizing film is smaller than a visible wavelength band of light.

* * * * *